(12) United States Patent
Chi Ho et al.

(10) Patent No.: US 11,094,562 B2
(45) Date of Patent: Aug. 17, 2021

(54) SEMICONDUCTOR DEVICE AND METHOD OF MANUFACTURE

(71) Applicant: NEXPERIA B.V., Nijmegen (NL)

(72) Inventors: Leung Chi Ho, Kwai Chung (HK);
Pompeo V. Umali, Kwai Chung (HK);
Shun Tik Yeung, Kwai Chung (HK)

(73) Assignee: Nexperia B.V., Nijmegen (NL)

( * ) Notice: Subject to any disclaimer, the term of this patent is extended or adjusted under 35 U.S.C. 154(b) by 19 days.

(21) Appl. No.: 16/220,125

(22) Filed: Dec. 14, 2018

(65) Prior Publication Data
US 2019/0189468 A1    Jun. 20, 2019

(30) Foreign Application Priority Data
Dec. 14, 2017  (EP) ..................... 17207326

(51) Int. Cl.
*H01L 21/56* (2006.01)
*H01L 23/31* (2006.01)
*H01L 23/00* (2006.01)

(52) U.S. Cl.
CPC .......... *H01L 21/565* (2013.01); *H01L 21/561* (2013.01); *H01L 21/568* (2013.01); *H01L 23/3171* (2013.01); *H01L 23/3185* (2013.01); *H01L 24/03* (2013.01); *H01L 24/05* (2013.01); *H01L 24/33* (2013.01); *H01L 24/96* (2013.01); *H01L 24/97* (2013.01);
(Continued)

(58) Field of Classification Search
CPC ......... H01L 2924/181; H01L 23/49541; H01L 21/56; H01L 23/495; H01L 23/49524; H01L 24/49; H01L 23/28; H01L 2224/04105; H01L 23/3107; H01L 23/3114; H01L 23/3185; H01L 2224/06157; H01L 2224/02371; H01L 2224/96; H01L 2224/3107; H01L 21/76838
USPC .................. 257/692, 693, 696, 787; 438/127
See application file for complete search history.

(56) References Cited

U.S. PATENT DOCUMENTS 4,529,960 A * 7/1985 Uchida ................ H01C 17/281
219/543
4,792,781 A * 12/1988 Takahashi ............ H01C 17/288
338/307
(Continued)

OTHER PUBLICATIONS

European Search Report and Written Opinion for the corresponding application EP17207326.4, 9 pages, dated Jun. 27, 2018.

*Primary Examiner* — David A Zarneke
(74) *Attorney, Agent, or Firm* — Ohlandt, Greeley, Ruggiero & Perle, LLP

(57) ABSTRACT

A semiconductor device structure and method of manufacturing a semiconductor device. The semiconductor device may comprise a semiconductor die having a top major surface that has one or more electrical contacts formed thereon, an opposing bottom major surface, and side surfaces; a molding material encapsulating the top major surface, the bottom major surface and the side surfaces of the semiconductor die, wherein the molding material defines a package body that has a top surface and a side surface; wherein the plurality of electrical contacts are exposed on the top surface of the package body and a metal layer is arranged over and electrically connected to the electrical contacts and wherein the metal layer extends to and at least partially covers a side surface of the package body.

12 Claims, 7 Drawing Sheets

(52) U.S. Cl.
CPC .......... *H01L 23/3114* (2013.01); *H01L 24/06* (2013.01); *H01L 2224/02371* (2013.01); *H01L 2224/0345* (2013.01); *H01L 2224/03462* (2013.01); *H01L 2224/0401* (2013.01); *H01L 2224/04026* (2013.01); *H01L 2224/04105* (2013.01); *H01L 2224/05023* (2013.01); *H01L 2224/05027* (2013.01); *H01L 2224/0556* (2013.01); *H01L 2224/05147* (2013.01); *H01L 2224/05548* (2013.01); *H01L 2224/05568* (2013.01); *H01L 2224/05572* (2013.01); *H01L 2224/05582* (2013.01); *H01L 2224/05611* (2013.01); *H01L 2224/06157* (2013.01); *H01L 2224/06187* (2013.01); *H01L 2224/325* (2013.01); *H01L 2224/96* (2013.01)

(56) References Cited

U.S. PATENT DOCUMENTS

| | | | |
|---|---|---|---|
| 5,656,863 A | 8/1997 | Yasunaga et al. | |
| 5,835,988 A * | 11/1998 | Ishii | H01L 23/3107 257/684 |
| 6,002,163 A * | 12/1999 | Wojnarowski | H01L 21/78 257/620 |
| 6,121,119 A * | 9/2000 | Richards | H01C 1/14 438/462 |
| 6,208,021 B1 * | 3/2001 | Ohuchi | H01L 24/02 257/690 |
| 6,337,510 B1 * | 1/2002 | Chun-Jen | H01L 23/3107 257/666 |
| 7,368,810 B2 * | 5/2008 | Seng | H01L 23/3114 257/673 |
| 7,385,299 B2 * | 6/2008 | Chow | H01L 24/73 257/787 |
| 7,495,319 B2 * | 2/2009 | Fukuda | H01L 21/565 257/666 |
| 7,615,859 B2 * | 11/2009 | Kim | H01L 23/3107 257/686 |
| 8,455,986 B2 * | 6/2013 | Kajiwara | H01L 24/29 257/673 |
| 8,461,671 B2 * | 6/2013 | Hu | H01L 21/56 257/678 |
| 8,846,453 B1 * | 9/2014 | Hsu | H01L 23/3171 438/113 |
| 9,406,646 B2 * | 8/2016 | Hosseini | H01L 23/3185 |
| 9,418,872 B2 * | 8/2016 | Eng | H01L 25/50 |
| 9,837,375 B2 * | 12/2017 | Chinnusamy | H01L 21/78 |
| 2002/0089043 A1 * | 7/2002 | Park | H01L 24/73 257/668 |
| 2005/0121795 A1 * | 6/2005 | Mauder | H01L 23/48 257/762 |
| 2005/0218494 A1 * | 10/2005 | Satou | H01L 23/3107 257/678 |
| 2006/0197187 A1 * | 9/2006 | Lohninger | H01L 24/05 257/584 |
| 2007/0170577 A1 | 7/2007 | Dangelmaier et al. | |
| 2014/0008818 A1 * | 1/2014 | Lee | H01L 24/95 |
| 2014/0252659 A1 * | 9/2014 | Tsai | H01L 23/3185 257/786 |
| 2014/0264888 A1 | 9/2014 | Hsu et al. | |
| 2015/0228557 A1 * | 8/2015 | Cheng | H01L 24/94 257/622 |
| 2015/0255358 A1 * | 9/2015 | Wen | H01L 21/268 257/738 |
| 2015/0287659 A1 * | 10/2015 | Liu | H01L 23/3192 257/737 |
| 2016/0049348 A1 * | 2/2016 | Zhao | H01L 21/565 257/620 |
| 2017/0011982 A1 * | 1/2017 | Theuss | H01L 23/3135 |
| 2019/0096821 A1 * | 3/2019 | Chiang | H01L 23/3171 |

* cited by examiner

SEMICONDUCTOR DEVICE AND METHOD OF MANUFACTURE

CROSS REFERENCE TO RELATED APPLICATION

The present application claims foreign priority to European Patent Application No. 17207326.4 filed on Dec. 14, 2017, the entirety of which is incorporated by reference hereby.

FIELD

The present disclosure relates to a semiconductor device and method of manufacture. More particularly the present disclosure relates to a wafer level semiconductor device with wettable side contacts.

BACKGROUND

Semiconductor devices in the form of wafer level packages (WLP) are becoming increasingly important for applications that require a small device footprint with improved electrical performance. Wafer level packages are commonly used, for example, in portable electronic devices such as mobile communications devices.

FIG. 1a is a cross-sectional side view of a conventional WLP 100. The WLP 100 includes a plurality of input or output (I/O) pads 102 exposed on a bottom surface of the WLP 100. The I/O pads 102 are mounted to contacts 104, such as pads on a printed circuit board (PCB) with solder 106.

FIG. 1b is an enlarged schematic bottom plan view of a part 108 of the WLP 100 along line A-A of FIG. 1a. The bottom surface of the WLP 100 includes the I/O pad 102, which is a metal area, a saw scribe lane area 110 located at a peripheral area of the bottom surface of the WLP 100, which is a non-passivated area, and a passivation overlap area 112 located between the I/O pad 102 and the saw scribe lane area 110.

However, as shown in FIG. 1b or excessive solder, together with a very narrow separation between the I/O pad 102 and the saw scribe lane area 110 can result in a flux residue or solder flake 114 which may bridge the active pad 102 and the saw scribed lane area 110, which can result in a short circuit between the I/O pads 102 and the die of the WLP 100.

In addition, because the active pad 102 does not extend all the way to the sides of the WLP 100, once the WLP 100 is mounted to the PCB and the I/O pads 102 are soldered to the corresponding contact 104, it is difficult to inspect the solder joints to determine if there are any potential solder joint defects.

SUMMARY

According to an embodiment there is provided a semiconductor device comprising: a semiconductor die having a top major surface that has one or more electrical contacts formed thereon, an opposing bottom major surface, and side surfaces; a molding material encapsulating the top major surface, the bottom major surface and the side surfaces of the semiconductor die, wherein the molding material defines a package body that has a top surface and a side surface; wherein the plurality of electrical contacts are exposed on the top surface of the package body and a metal layer is arranged over and electrically connected to the electrical contacts and wherein the metal layer extends to and at least partially covers a side surface of the package body.

Optionally, the metal layer may comprise copper and the metal layer may be coated with a wettable material, such as tin.

Optionally, the metal layer may extend across the width of the top surface of the package body.

Optionally, the molding material may be arranged unitarily to encapsulate to the semiconductor die.

According to an embodiment there is provided a method for assembling a semiconductor device, the method may comprise: providing an plurality of spaced apart semiconductor dies, the semiconductor die having a top major surface with one or more electrical contacts formed thereon, an opposing bottom major surface and side surfaces, wherein each die has a plurality of electrical contacts formed on a top surface; encapsulating the dies with a molding material, wherein the molding material partially covers partially top surfaces such that the electrical contacts are exposed and covers the bottom surface and side surface of the dies; cutting a plurality of first trenches to defines a package body side wall of each semiconductor device; forming a metal layer over a top surface of each package body, wherein the metal layer electrically contacts the electrical contacts, and extends to the side surface of each package body; and singulating the semiconductor devices from each other.

Optionally, the metal layer may comprise copper and the metal layer may be formed by sputtering or plating. Optionally, the metal layer may be coated with a wettable material by electro-plating. The metal layer may extend across the width of the top surface of the package body.

Optionally, molding the semiconductor dies comprises unitarily to encapsulating each semiconductor die with a molding material.

DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 1b shows is an enlarged bottom plan view of the conventional wafer level semiconductor device of FIG. 1a taken along line A-A of FIG. 1a;

DETAILED DESCRIPTION

Figure 1A:
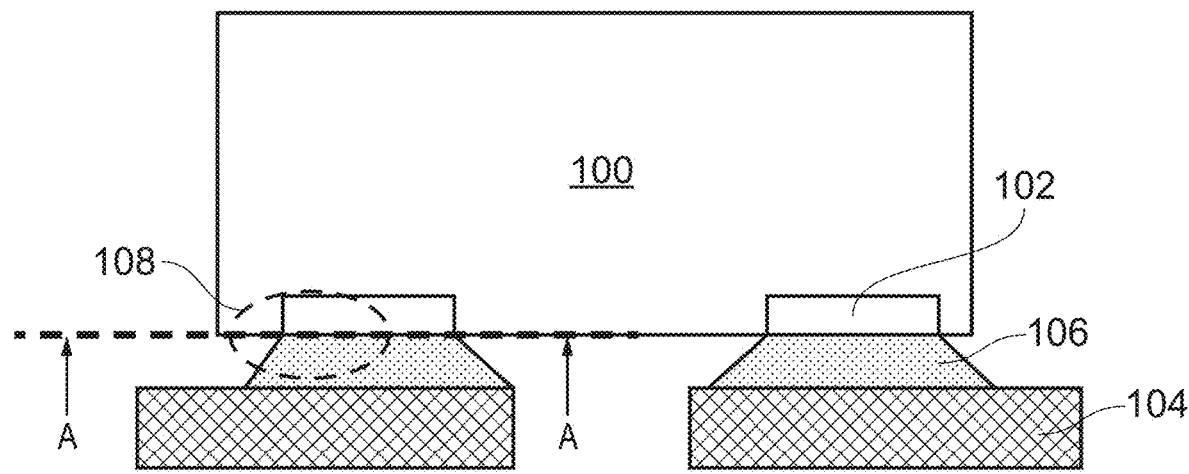
FIG. 1a shows a cross-sectional side view of a conventional wafer level semiconductor device.
Figure 1B:
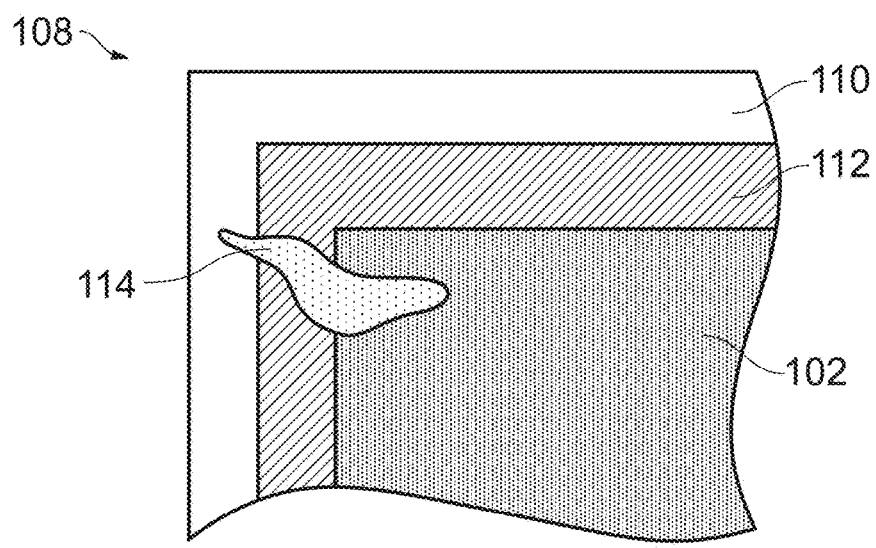
Figure 2:
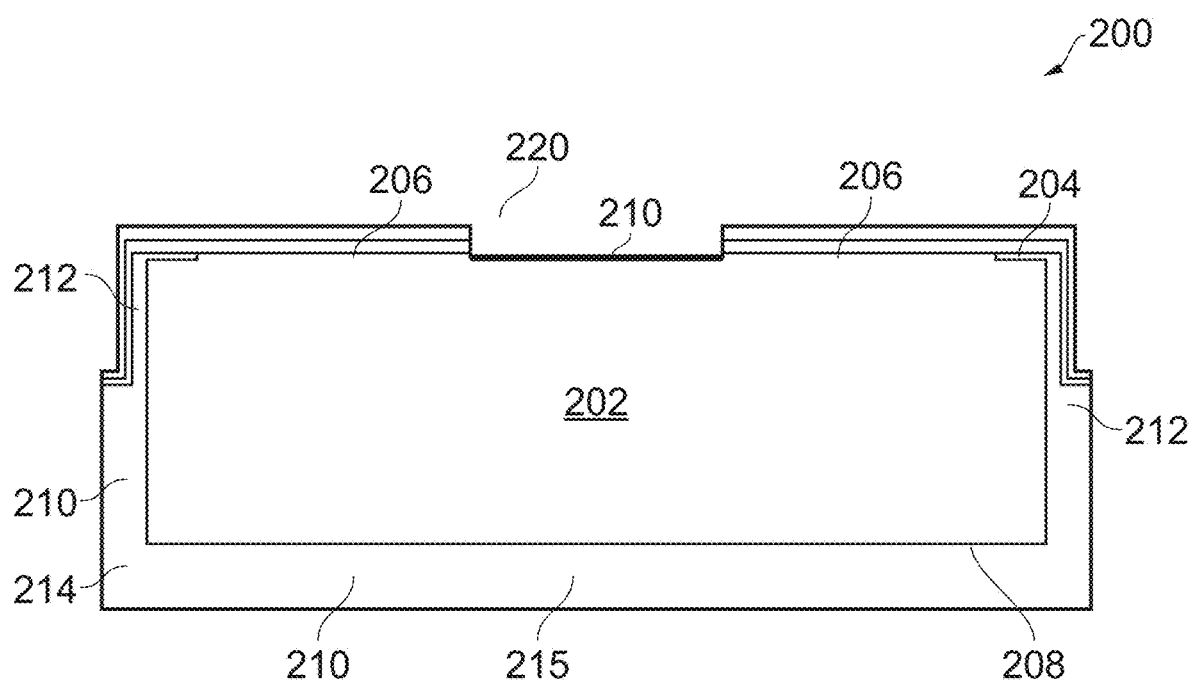
FIG. 2 illustrates an a cross-sectional side view a wafer level semiconductor device in accordance with an embodiment.

With reference to FIG. 2, a cross section of an example wafer level semiconductor device 200 in accordance with an embodiments is illustrated. The device 200 includes a semiconductor die 202 having a top major surface 204 and an opposing bottom major surface 208. The top major surface 204 of the semiconductor die 202 has one or more electrical contacts 206 formed thereon. The semiconductor die 202 may comprises one or more active components (not illustrated) such as transistors or diodes, and one or more electrical contacts 206. The electrical contacts may preferably be formed by depositing a patterned metal layer on the die top surface 204, to provide electrical connections to the one or more active components of the semiconductor die 202.

The semiconductor device 200 also includes a molding material 210 that covers the bottom surface 208 and each of side the surfaces of the semiconductor die 202. In addition the molding material 210 covers at least a part of the top surface 204 of the semiconductor die, wherein the contacts 204 arranged on the top surface 204 will be free from molding material 210.

The molding material 210 defines a package body that has a top surface 212, respective side surfaces 214 and a bottom surface 215. Where the electrical contacts 206 are free from molding material 210, openings are defined in the top surface 212 of the package body such that the electrical contacts 206 are at least partially exposed through the openings in the molding material 210. Depending on the molding process used, the tops of the electrical contacts may be substantially level with the top of the molding material 210. Alternatively, the tops of the contacts may be arranged to be below the top of the molding material 210. The device 200 further includes a metal layer 218 formed over and electrically connected to the electrical contacts 206 through the openings 216. The metal layer 218 extends to and at least partially cover the side surface 214 of the package body.

The metal layers 218, which are respectively electrically connected to the electrical contacts 206, are spaced and isolated from each other by a gap 220 located therebetween. The metal layers 218 form an intermetallic layer between the metallic electrical contacts 206 and I/O pads 222 (discussed below) of the semiconductor device 200.

The metal layers 218 may comprise copper and the metal layer 218 is coated with a wettable material, such as tin, by a for example a plating process, to form the I/O pads 222 such that the device 200 has wettable flanks that allow for solder joint to be formed between the I/O pads 222 and the contact pads of a PCB. The metal layer 218 having the wettable material forms an I/O pad that allow for solder joint inspection by for example Automatic Optical Inspection, as required by automotive qualified semiconductor devices. In addition, because the top surface 204 of the semiconductor die 202, with the exception of the location of the electrical contacts as discussed above, is covered with molding material the packaged semiconductor die is protected on six sides by the molding material. As a result, the chance of flux residues or solder flakes causing a short circuit between the I/O pads 102 and the semiconductor die 202 when mounting to a PCB is reduced. Furthermore, the arrangement as described above may result in a lower package height because there is no need for die carrier or mount.

Figure 3A:
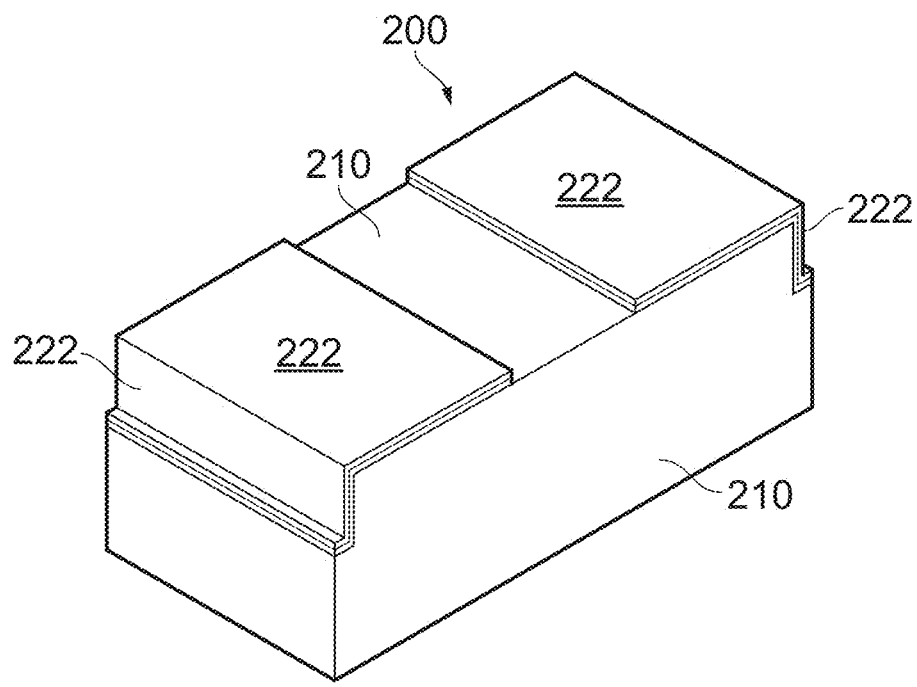
FIG. 3a illustrates an isometric view of a wafer level semiconductor device in accordance with an embodiment.

Referring to FIG. 3a, which illustrates an isometric view of the semiconductor device 200 according to an embodiment, the I/O pads 222 may extend across the entire width of the of the top surface of the package body and also across the entire width of the side surfaces 214 of the package body. When the semiconductor device 200 is mounted on a carrier, such as a PCB, this arrangement of I/O pads 222 results in improved visibility of the solder joint connecting the I/O pad 222 to a contact pad of the PCB.

Figure 3B:
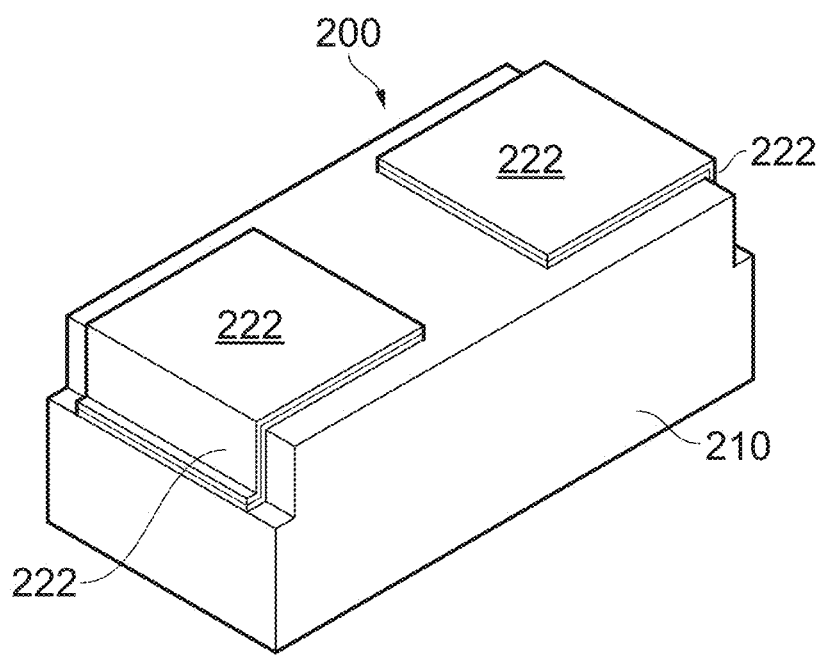
FIG. 3b illustrates an isometric view of a wafer level semiconductor device in accordance with an embodiment.

In an alternative arrangement, as illustrated in FIG. 3b which illustrates an isometric view of the semiconductor device 200 according to an embodiment, the I/O pads 222 may extend partially across the width of the of the top surface of the package body and also partially across the width of the side surfaces 214 of the package body.

Option 3a, the solder pad which is larger with same body width and the solder is very visible than option 3b.

Figure 4A:
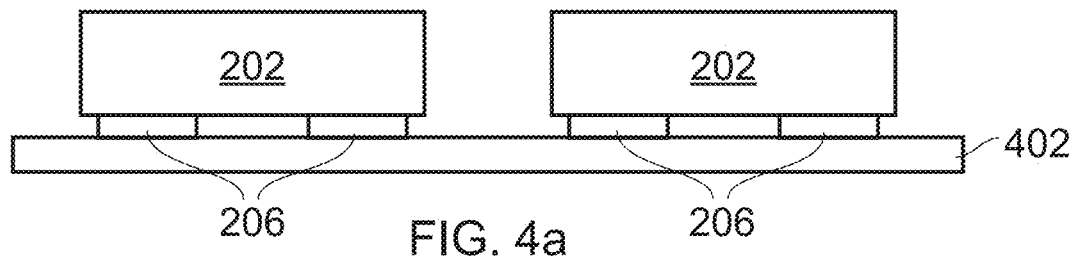
FIG. 4a illustrates the step of mounting a semiconductor die on a carrier tape.

FIGS. 4a to 4e illustrate the steps in molding the wafer level semiconductor device in accordance with an embodiment. Semiconductor dies 202 are initially singulated (not Illustrated) from a wafer containing an array of such semiconductor dies 202. As illustrated in FIG. 4a, semiconductor dies 202 are mounted on a carrier tape 402. The semiconductor dies 202 are mounted by way of the electrical contacts 206 which are fixed to the carrier tape 402.

In an alternative process the wafer containing an array of such semiconductor dies 202 may be mounted on a carrier tape 402. The semiconductor dies 202 may then be singulated, without cutting the carrier tape 402 such that they remain on the carrier tape 402 ready for molding.

Figure 4B:
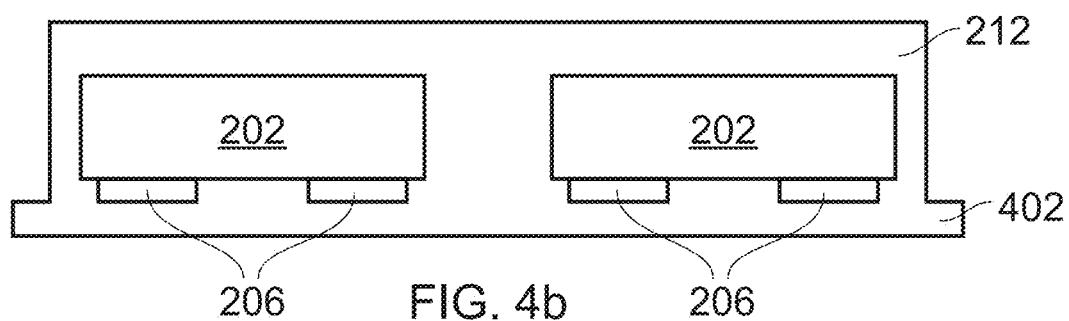
FIG. 4b illustrates the step of encapsulating the semiconductor die.

Following mounting of the semiconductor dies 202 on the carrier tape 402 the semiconductor dies 202 are then molded as illustrated in FIG. 4b. The molding process may be a film assisted molding process whereby the 402 prevents molding material 212 from covering the top surfaces of the electrical contacts 206. As discussed above this results in the top surface of the electrical contacts 206 being substantially level with the top surface of the mold material 212. Use of the carrier tape 402 also prevents molding material 212 from covering the electrical contacts 206, such that the electrical contacts 206 are free from molding material 212 as discussed above. Furthermore, using this method of molding ensure at all six-sides of the semiconductor die, with the exception of the location of the electrical contacts is covered in a single step by a single unitarily formed molding material 212.

Figure 4C:
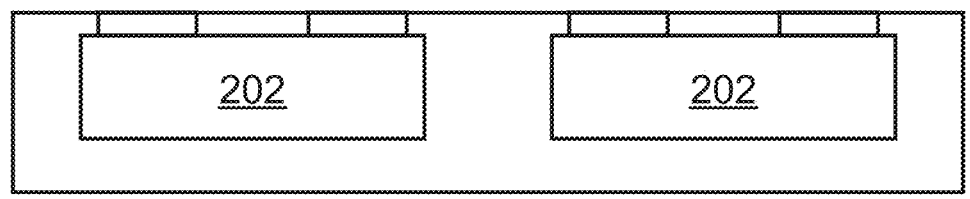
FIG. 4c illustrates the step of removing the carrier tape.
Figure 4D:
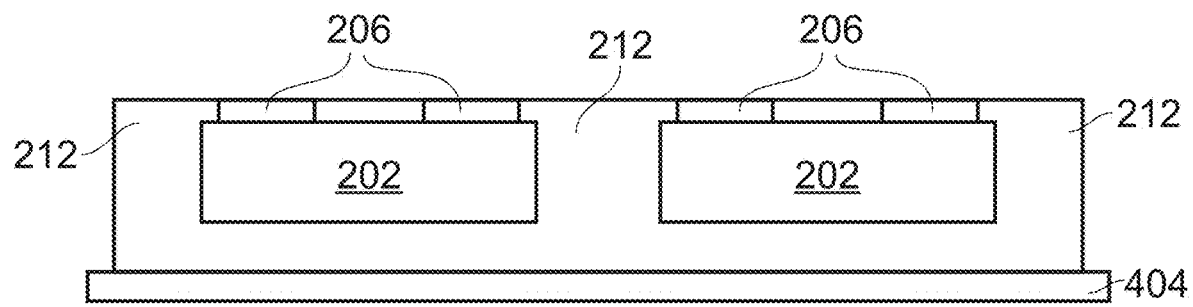
FIG. 4d illustrates the step of mounting the encapsulated semiconductor die on a temporary carrier.

Following removal of the carrier tape 402 as illustrated in FIG. 4c, the molded array of semiconductor dies 202 is then mounted on an a carrier 404 as illustrated in FIG. 4d such that the electrical contacts 206 face upwards from the carrier. The carrier 404 may be any appropriate temporary carrier such as a film frame carrier (FFC), to hold the individual semiconductor devices 202 in place during singulation (as discussed below).

Figure 4E:
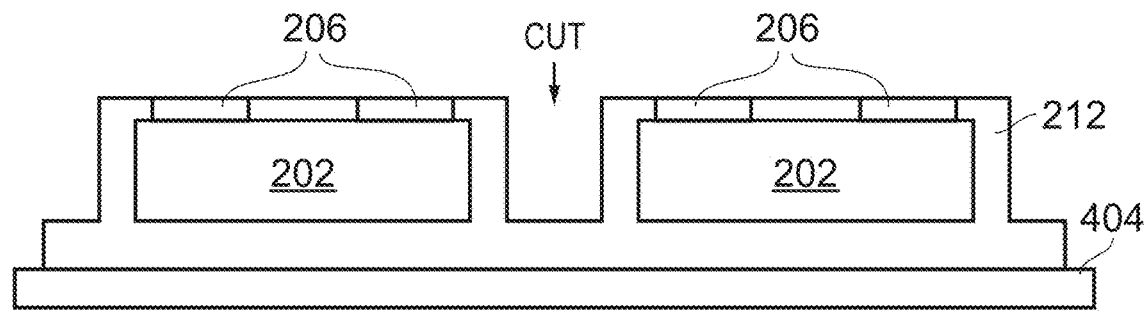
FIG. 4e illustrates the step of partially singulating the semiconductor die.

Following mounting of the semiconductor dies 202 on the FFC 404 a partial cut is made into the molding material 212 in a direction towards the FFC 404 as illustrated in FIG. 4e. The cuts are made between adjacent sidewalls of adjacent semiconductor dies 202 in an array of such dies. The cut is partial in that it does not extend fully through the molding material 212 and terminates prior to the FFC 404 thus forming trenches in the molding material 212 and partially defining the side walls of the semiconductor device 200. The cuts may be made using any appropriate means such as a laser or a saw blade of appropriate kerf.

Figure 5A:
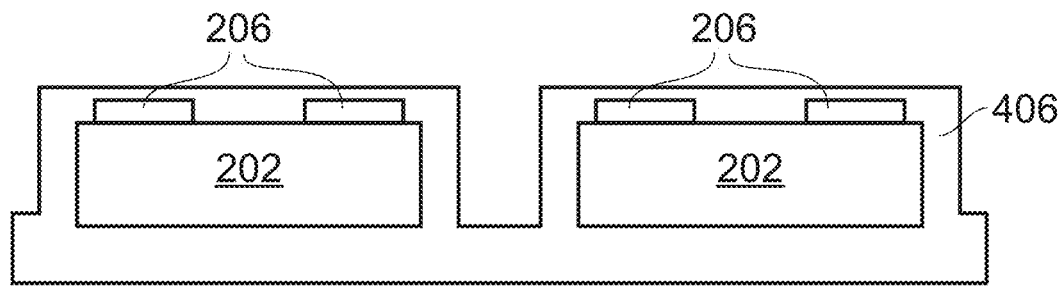
FIG. 5a illustrates the formation of the metallic interlayer.

Following the above molding and cutting steps the I/O pads 222 are then formed as illustrated with reference to FIGS. 5a to 5d. As illustrated in FIG. 5a, a metal layer 406 is formed over the top surface, that is the surface having the electrical contacts 206 of each package body, such that the metal layer is electrically connected to the electrical contacts 206. The metal layer 406 also extends to the side surface of each package body and a bottom surface formed by the trenches cut in the molding material. Optionally, the metal layer 406 is formed by sputtering or plating and the metal layer 406 may comprise copper.

Figure 5B:
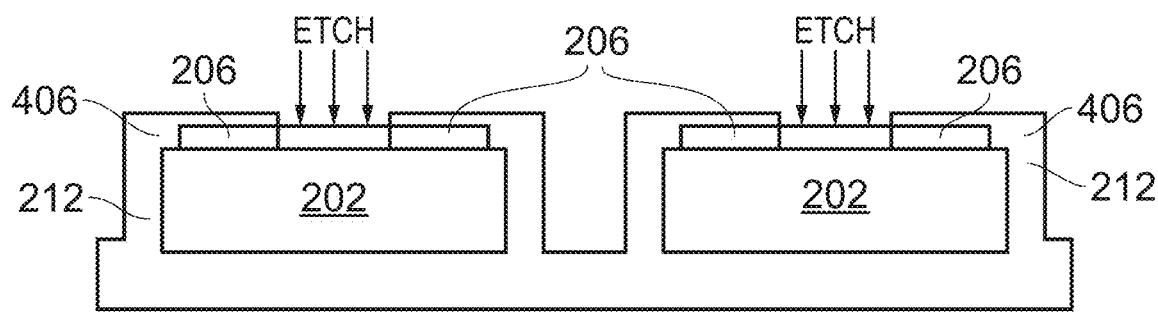
FIG. 5b illustrates the further formation of the metallic interlayer.
Figure 5C:
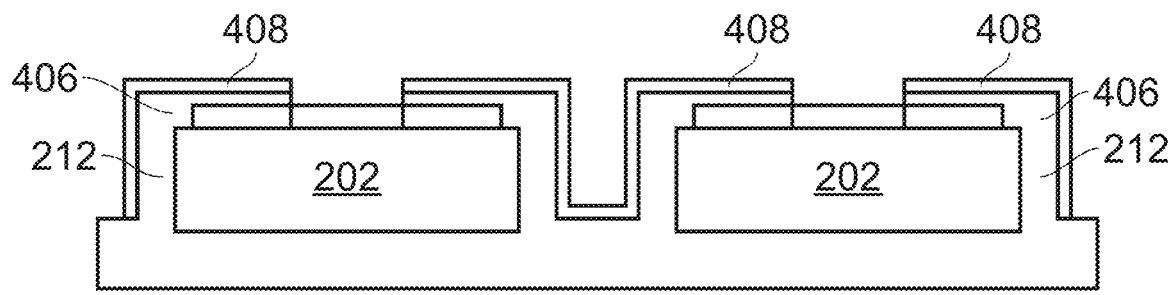
FIG. 5c illustrates the formation of formation of metallic I/O pads.

As illustrated in FIG. 5b, the metal layer interlayer 406 may be removed from the top of the package between the contacts 206, in order to prevent a short circuit therebetween. The metal layer 406 may be removed by etching or cutting. The step of removing the metal interlayer layer 406 may expose the molding material at the top of the package. Following formation of the metal interlayer 406 and as illustrated in FIG. 5c the metal inter layer is coated with a wettable material 408 by electro-plating to complete formation of the I/O pads 222. The wettable material 440 may comprise tin. Optionally, the electro-plating is performed prior to removal of the metal interlayer 406 between the contacts 206.

Figure 5D:
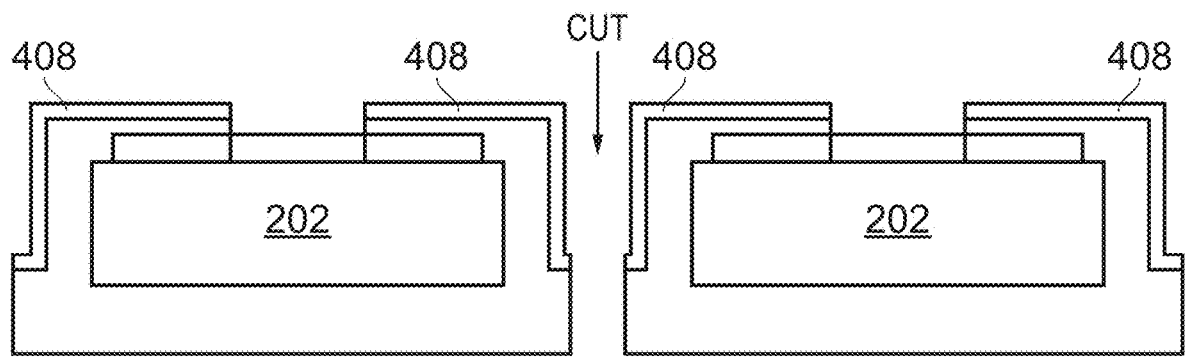
FIG. 5d illustrates singulation of the wafer level semiconductor devices according to embodiments.
Figure 5E:
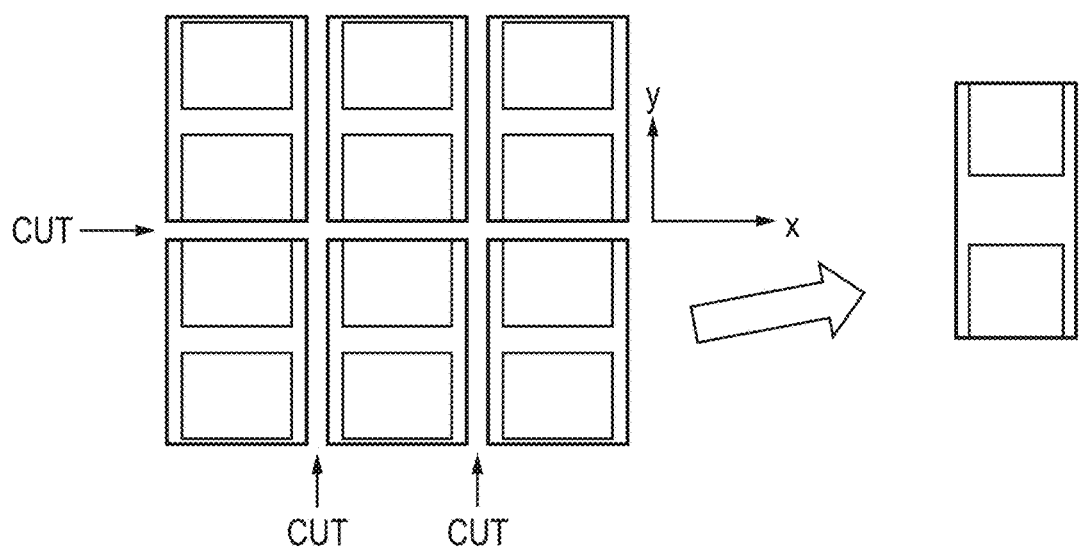
FIG. 5e illustrates a plan view of an array of wafer level semiconductor devices following singulation.

As illustrated in FIG. 5d singulation is performed along the trenches and between the remaining adjacent side walls to singulate the semiconductor devices 200 from each other. The singulation process is described in more detail with respect to FIG. 5e. As discussed above with respect to FIG. 4e a partial cut is made through the molding material 212 prior to formation of the I/O pads 222. Following formation of the I/O pads 222 a first cut is carried out through the molding material 212 in the y-direction. A second cut is then carried out in the x-direction following the partial cut described above. This second cut may optionally be made with saw which has a smaller kerf than the kerf of the saw used for making the partial cut. This results in a stepped feature in the side wall of the molding material.

Whilst the above examples illustrate two I/O pads 222, the skilled person will see that based on the above discussion any number or arrangement may be achieved without departing from the scope of the present disclosure. In this way, the skilled person will see that the above example may be applicable to for example dual silicon no-lead (DSN) arrangements.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A semiconductor device, comprising:
    a semiconductor die having a top major surface that has one or more electrical contacts formed thereon, an opposing bottom major surface, and side surfaces;
    a molding material encapsulating the top major surface, the bottom major surface and the side surfaces of the semiconductor die, wherein the molding material defines a package body that has a top surface and a side surface, and the molding material alone is arranged unitarily to encapsulates the semiconductor die;
    wherein the plurality of electrical contacts are exposed on the top surface of the package body and a metal layer is arranged over the top surface of the plurality of electrical contacts and electrically connected to the electrical contacts, and
    wherein the metal layer extends to and at least partially covers the side surface of the package body, and does not extend to the bottom major surface of the package body.

2. The semiconductor device of claim 1, wherein the metal layer comprises copper.

3. The semiconductor device of claim 1, wherein the metal layer is coated with a wettable material.

4. The semiconductor device of claim 3, wherein the wettable material comprises tin.

5. The semiconductor device of claim 1, wherein the metal layer extends across a width of the top surface of the package body.

6. The semiconductor device of claim 1, wherein the metal layer extends to and at least partially covers the side surface in contact along the package body.

7. A method for assembling a semiconductor device, the method comprising: providing a plurality of spaced apart semiconductor dies, each semiconductor die having a top major surface with one or more electrical contacts formed thereon, an opposing bottom major surface, and side surfaces, wherein each semiconductor die has a plurality of electrical contacts formed on a top surface;
    encapsulating the semiconductor dies with a molding material, wherein the molding material partially covers partially the top surfaces of each of the semiconductor dies such that the electrical contacts are exposed and the molding material covers the bottom surface and side surfaces of each of the semiconductor dies;
    cutting a plurality of first trenches to define a plurality of package body side walls for a plurality of package bodies;
    forming a metal layer over a top surface of each of the package bodies, wherein the metal layer electrically contacts the electrical contacts, and extends to the side surface of each package body; and singulating the package bodies from each other to form a plurality of semiconductor devices.

8. The method of claim 7 wherein the metal layer comprises copper.

9. The method of claim 7 wherein the metal layer is formed by sputtering or plating.

10. The method of claim 7 further comprising coating the metal layer with a wettable material by electro-plating.

11. The method of claim 7, wherein the metal layer extends across a width of the top surface of each package body.

12. The method of claim 7, wherein the encapsulating of the semiconductor dies with the molding material comprises unitarily encapsulating each semiconductor die with the molding material.

* * * * *